US008618839B2

(12) United States Patent
Chi et al.

(10) Patent No.: US 8,618,839 B2
(45) Date of Patent: Dec. 31, 2013

(54) UTILIZING A SENSE AMPLIFIER TO SELECT A SUITABLE CIRCUIT

(75) Inventors: Howard H. Chi, Littleton, MA (US); Haitao O. Dai, Boston, MA (US); Kai D. Feng, Hopewell Junction, NY (US); Donald J. Papae, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/418,961

(22) Filed: Mar. 13, 2012

(65) Prior Publication Data
US 2013/0241652 A1 Sep. 19, 2013

(51) Int. Cl.
*G01R 19/00* (2006.01)

(52) U.S. Cl.
USPC .............................. 327/51; 380/46

(58) Field of Classification Search
USPC .......................................................... 327/51
See application file for complete search history.

(56) References Cited

U.S. PATENT DOCUMENTS

| | | | | |
|---|---|---|---|---|
| 6,161,213 A | * | 12/2000 | Lofstrom | 324/750.15 |
| 6,867,580 B1 | * | 3/2005 | de Jong et al. | 324/762.02 |
| RE40,188 E | | 3/2008 | Lofstrom | |
| 2008/0061840 A1 | * | 3/2008 | Hwang et al. | 327/51 |
| 2008/0141364 A1 | | 6/2008 | Skoric et al. | |
| 2008/0175090 A1 | * | 7/2008 | Pawlowski | 365/230.08 |
| 2008/0279373 A1 | | 11/2008 | Erhart et al. | |
| 2010/0090744 A1 | * | 4/2010 | Lee | 327/307 |
| 2010/0195865 A1 | * | 8/2010 | Luff | 382/100 |
| 2010/0201423 A1 | * | 8/2010 | Lo et al. | 327/307 |
| 2010/0293612 A1 | | 11/2010 | Potkonjak | |
| 2011/0002461 A1 | | 1/2011 | Erhart et al. | |
| 2011/0317829 A1 | | 12/2011 | Ficke et al. | |

FOREIGN PATENT DOCUMENTS

WO 2011088074 A2 7/2011

OTHER PUBLICATIONS

Ganta et al., "A Highly Stable Leakage-Based Silicon Physical Unclonable Functions" 2011 24th Annual Conference on VLSI Design (VLSI Design), Jan. 2-7, 2011, pp. 135-140, IEEE. <URL: http://ieeexplore.ieee.org/stamp/stamp.jsp?tp= &arnumber=5718791> / doi: 10.1109/VLSID.2011.72.

* cited by examiner

*Primary Examiner* — Long Nguyen
*Assistant Examiner* — Patrick Chen
(74) *Attorney, Agent, or Firm* — Isaac J. Gooshaw; Abdul-Samad A. Adediran

(57) ABSTRACT

Embodiments of the present invention provide an approach for utilizing a sense amplifier to select a suitable circuit, wherein a suitable circuit generates a voltage that is greater than or equal to a configurable reference voltage. An amplifier gain selector selects a voltage gain of a sense amplifier having input terminals, auxiliary inputs, an output, an array of resistive loads, and the amplifier gain selector. Auxiliary inputs are utilized to nullify direct current (DC) offset voltage of the sense amplifier. Combinatorial logic circuitry connects the input terminals of the sense amplifier to output terminals of a circuit that is within a group of circuits. A comparator circuit determines if the circuit generates a voltage greater than or equal to a configurable reference voltage, based on the output of the sense amplifier.

20 Claims, 3 Drawing Sheets

UTILIZING A SENSE AMPLIFIER TO SELECT A SUITABLE CIRCUIT

BACKGROUND

1. Field of the Invention

The present invention relates generally to a sense amplifier, and more particularly to utilizing the sense amplifier in order to select a suitable circuit that generates a voltage greater than or equal to a configurable reference voltage.

2. Description of the Related Art

Computing devices are widely used for performing tasks that involve storage and transmission of sensitive information. Moreover, with the rise of cybercrime and the increased interconnectivity between computing devices, via computer networks, a person can circumvent cybersecurity built to protect the computing devices and obtain unauthorized access to the sensitive information through the Internet. Therefore, it is important to provide increased protection of the sensitive information to prevent unauthorized access. However, protecting the sensitive information from unauthorized access can be challenging and expensive.

It is known to utilize integrated circuits to perform authentication in order to protect the sensitive information on the computing devices from unauthorized access. A single field-effect transistor comparison physically unclonable function circuit (SFC circuit) can generate a random output voltage signal that corresponds to a random data bit of "1" representing logic HIGH or "0" representing logic LOW, wherein the random data bit can be utilized to yield a random data bit sequence for purposes of authentication. Specifically, a series of SFC circuits can be operatively connected to generate random output voltage signals that can be combined to yield the random data bit sequence of ones and zeroes. The random data bit sequence can be utilized to generate a secret key for purposes of authentication. Moreover, the secret key generated can provide a high level of security around sensitive information on a computing device because a person trying to gain unauthorized access to the secret key must do so while the SFC circuits are powered on and operating, since the secret key is not stored in memory but instead is generated utilizing physical characteristics of the SFC circuit while in operation.

Furthermore, it is also known for a SFC circuit to generate a strong random output voltage signal (i.e., a magnitude greater than about 50 mV) or a weak random output voltage signal (i.e., a magnitude less than about 50 mV) at the output of the circuit. However, it is not desirable for the SFC circuit to generate a weak random output voltage signal, because the polarity of the weak random output voltage signal can vary based on operating temperature variation of the SFC circuit. If the polarity of the output voltage of a SFC circuit varies, then a random data bit sequence that is formed utilizing the SFC circuit, may have an error. An error in the random data bit sequence can result in generating a secret key that is not reliable. A secret key that is not reliable may result in a failure of an authentication process that utilizes the secret key and involves cryptographic operations, which can prevent a non-adversarial computing device from authenticating itself and accessing information when needed. Accordingly, it is desirable to select suitable SFC circuits that generate strong random output voltage signals that do not change polarity based on operating temperature variation of the SFC circuits and that can be utilized to generate a secret key.

SUMMARY

A first aspect of an embodiment of the present invention discloses a method for utilizing a sense amplifier to select a suitable circuit. An amplifier gain selector selects a voltage gain of a sense amplifier having input terminals, auxiliary inputs, an output, an array of resistive loads, and the amplifier gain selector. Voltage into the auxiliary inputs adjusts to nullify direct current (DC) offset voltage of the sense amplifier. Combinatorial logic circuitry connects the input terminals of the sense amplifier to output terminals of a circuit that is within a group of circuits. A comparator circuit determines if the circuit generates a voltage greater than or equal to a configurable reference voltage, based on the output of the sense amplifier.

A second aspect of an embodiment of the present invention discloses a structure utilizing a sense amplifier to select a suitable circuit. The structure comprises at least one array that includes one or more groups of circuits. At least one sense amplifier is operatively connected to combinatorial logic circuitry, each of the one or more groups of circuits, a first analog-to-digital converter (ADC), a second ADC, and a comparator circuit having an output. A digital control application specific integrated circuit (ASIC) is operatively connected to the combinatorial logic circuitry and the comparator circuit.

BRIEF DESCRIPTION OF THE SEVERAL VIEWS OF THE DRAWINGS

The subject matter which is regarded as an embodiment of the present invention is particularly pointed out and distinctly claimed in the claims at the conclusion of the specification. One manner in which recited features of an embodiment of the present invention can be understood is by reference to the following detailed description of embodiments, taken in conjunction with the accompanying drawings in which:

DETAILED DESCRIPTION

Exemplary embodiments now will be described more fully herein with reference to the accompanying drawings. This disclosure may, however, be embodied in many different forms and should not be construed as limited to the exemplary embodiments set forth herein. Rather, these exemplary embodiments are provided so that this disclosure will be thorough and complete, and will fully convey the scope of this disclosure to those skilled in the art. In the description, details of well-known features and techniques may be omitted to avoid unnecessarily obscuring the presented embodiments.

Embodiments of the present invention utilize a sense amplifier to select a suitable single field-effect transistor comparison physically unclonable function circuit (SFC circuit) that can be utilized for generating a random data bit sequence having N bits. The random data bit sequence can be used by computing devices and computer systems to generate a reliable secret key for purposes of authentication. Embodiments of the present invention that include a sense amplifier operatively connected to a group of circuits, a first analog to digital converter, a second analog to digital converter, and a comparator circuit are provided. In the disclosed embodiment, the group of circuits include SFC circuits, but in alternative embodiments the group of circuit can include other circuits that are needed by an end-user to generate a voltage that is greater than or equal to a configurable reference voltage.

Figure 1:
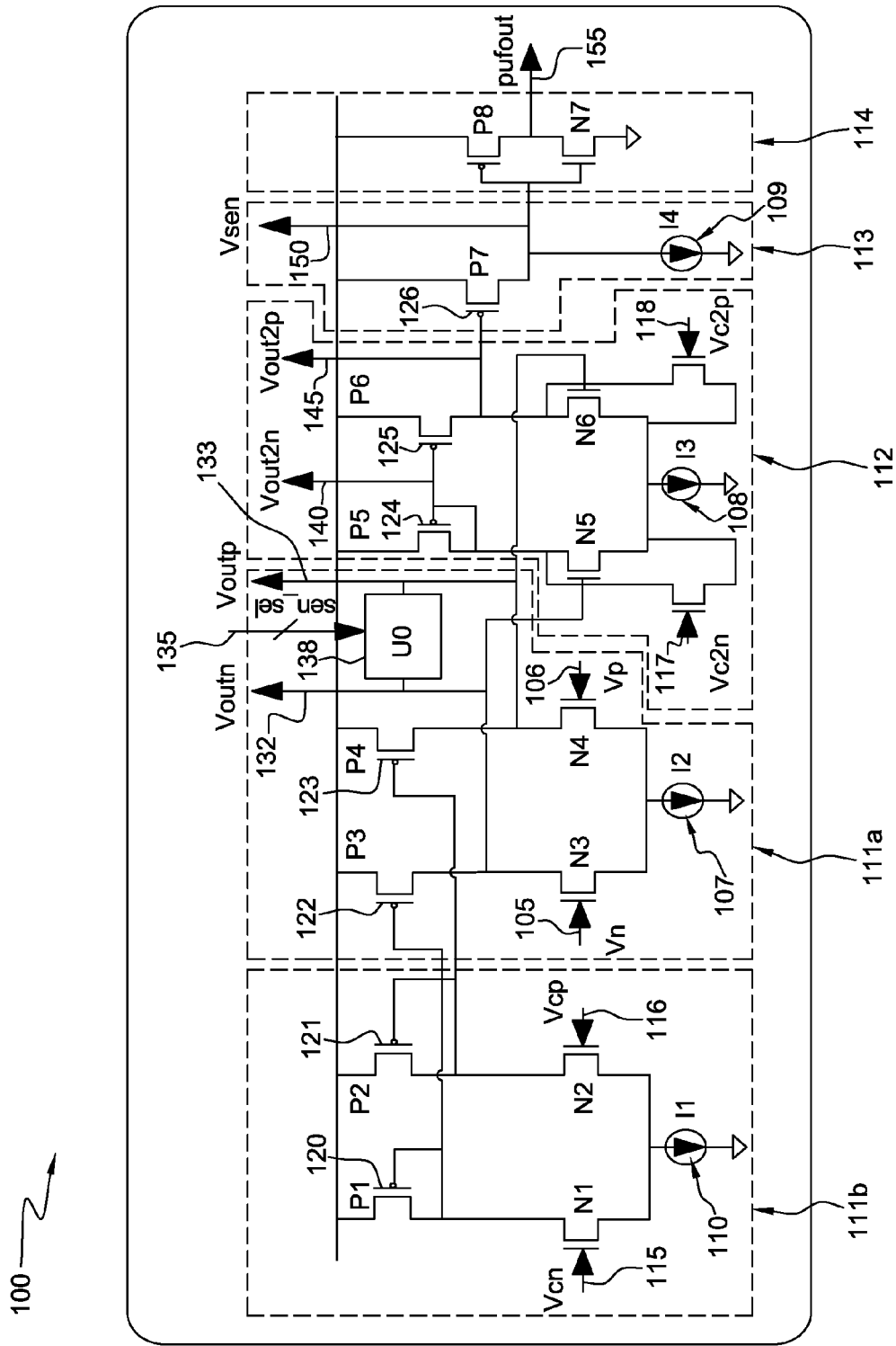
FIG. 1 is a schematic of a sense amplifier having three stages according to an embodiment of the present invention.

Referring now to FIG. 1, a schematic depicting current topology of sense amplifier 100. The sense amplifier 100 includes input terminals 105 and 106, auxiliary inputs 115 and 116, auxiliary inputs 117 and 118, logic switches 120-126, first stage differential voltage output probing terminals 132 and 133, amplifier gain selector 135, array of resistive loads 138, second stage probing terminals 140 and 145, output 150, and inverted output 155. In addition, sense amplifier 100 has three stages, which are first stage 111a, second stage 112, and third stage 113. First stage 111a and second stage 112 each include a pair of n-type field-effect transistors that are controlled by a pair of logic switches 122-123 and 124-125, respectively. Logic switches 120-126 are p-type field-effect transistors. In response to a voltage applied at input terminals 105 and 106, first stage 111a has tail current 107, second stage 112 has tail current 108, and third stage 113 has tail current 109. In addition, a tail current 110 is generated in response to a voltage applied at auxiliary inputs 115 and 116 of first stage auxiliary port circuit 111b. Moreover, sense amplifier 100 also has fourth stage 114 that is an inverter buffer.

Sense amplifier 100 is utilized to detect and amplify a voltage difference between input terminals 105 and 106. Specifically, sense amplifier 100 provides, at output 150, an amplified version of the voltage difference between input terminals 105 and 106. The amplified version of the voltage difference, at output 150, can be utilized to determine whether an SFC circuit having output terminals connected to input terminals 105 and 106 is suitable for generating a random data bit. For example, an SFC circuit can be considered suitable if it generates a strong random output voltage signal having a magnitude of at least about 50 mV. However, the magnitude of the output voltage signal from the SFC circuit, for the SFC circuit to be considered suitable for generating a random data bit, may vary based on fabrication process technologies. A SFC circuit that generates a strong random output voltage signal is less susceptible to having an output voltage that changes polarity based on operating temperature variation of the SFC circuit. An SFC circuit having an output voltage that does not change polarity based on operating temperature variation of the SFC circuit, can be utilized to generate a random data bit sequence having N bits. The random data bit sequence can be used to generate a reliable secret key for purposes of authentication.

In addition, prior to utilizing output 150 to determine the suitability of an SFC circuit, sense amplifier 100 needs to be calibrated. To calibrate sense amplifier 100 a voltage gain of sense amplifier 100 is configured by utilizing amplifier gain selector 135 to select a value of a resistor from array of resistive loads 138. Array of resistive loads 138 includes a variety of resistor values. However, the value of the resistor that is selected corresponds to a sensitivity level that needs to be reached in order to achieve a desired strong voltage signal at output 150 of sense amplifier 100. In the disclosed embodiment, the magnitude of the desired strong voltage signal is greater than about 50 mV, but in alternative embodiments the magnitude may be different. Sensitivity level, as defined herein, refers to the magnitude of input voltage that is applied at input terminals 105 and 106 and is needed to obtain the desired strong voltage signal at output 150, based on the value of the resistor that is selected from array of resistive loads 138. In addition, calibration of sense amplifier 100 includes adjusting auxiliary inputs 115-118 to nullify direct current offset voltage (DC offset voltage) of sense amplifier 100. Specifically, auxiliary inputs 115-118 can be utilized to apply a voltage to generate a delta change in current that nullifies DC offset voltage attributable to first stage 111a and second stage 112, of sense amplifier 100. DC offset voltage refers to a DC voltage level that is added to a signal of interest by related circuitry. If a DC offset voltage is significant it can reduce the quality of a signal of interest.

In the disclosed embodiment, circuitry such as sense amplifier 100 can have a DC offset voltage that is generated by first stage 111a and second stage 112. If the DC offset voltage of sense amplifier 100 is nullified, then sense amplifier 100 can accurately detect and amplify the voltage difference between input terminals 105 and 106. Furthermore, if sense amplifier 100 can accurately detect and amplify the voltage difference between input terminals 105 and 106, then output 150 of sense amplifier 100 will have a high reliability for selecting a suitable SFC circuit because output 150 would provide an accurate reading of an SFC circuit's output. However, if the detection and amplification of the SFC circuit's output is inaccurate then the SFC circuit may not be selected even though the SFC circuit generates a strong random output voltage signal (i.e., a voltage signal having a magnitude greater than, for example, about 50 mV).

For example, in regard to calibration, if sense amplifier 100 has a DC offset voltage of 25 mV during power on then auxiliary inputs 115-118 can be utilized to apply a compensation voltage to nullify the DC offset voltage of 25 mV. As mentioned above, the DC offset voltage of sense amplifier 100 can be generated by first stage 111a and second stage 112. Therefore, to nullify the DC offset voltage, subsequent to applying a bias voltage to input terminals 105 and 106 of sense amplifier 100, voltage into auxiliary inputs 115 and 116 is adjusted (i.e., incremented or decremented) while measuring differential output voltage from first stage differential voltage output probing terminals 132 and 133. Particularly, the voltage into auxiliary inputs 115 and 116 is adjusted (i.e., incremented or decremented) until an amount of the DC offset voltage attributable to first stage 111a is less than a first configurable threshold of about 0.2 uV. Subsequently, voltage into auxiliary inputs 117 and 118 is adjusted (i.e., incremented or decremented) while measuring output voltage, of sense amplifier 100, from second stage probing terminals 140 and 145. The voltage into auxiliary inputs 117 and 118 is adjusted until the amount of the DC offset voltage attributable to second stage 112 is less than a second configurable threshold of about 15 uV. If the amount of the DC offset voltage attributable to first stage 111a is less than the first configurable threshold (i.e., 0.2 uV) and the amount of the DC offset voltage attributable to second stage 112 is less than the second configurable threshold (i.e., 15 uV), then DC offset voltage is considered nullified.

Subsequent to the DC offset voltage nullification, input terminals 105 and 106 of sense amplifier 100 are connected to output terminals of an SFC circuit to determine whether the SFC circuit is suitable for generating a random data bit. The SFC circuit is considered suitable if it generates a strong random output voltage signal having a required magnitude, for example, of at least about 50 mV. However, the magnitude of the output voltage signal may vary based on fabrication process technologies. If the SFC circuit does not generate a strong random voltage signal then other available SFC circuits are verified to determine if they generate a strong random voltage signal until enough SFC circuits that generate a strong random voltage signal are identified. If not enough SFC circuits that generate a strong random voltage signal having the required magnitude are identified, then sense amplifier 100 is calibrated again. To calibrate sense amplifier 100, gain selector 135 is utilized to increase the voltage gain of sense amplifier 100 by selecting a different resistor having a higher resistive value from array of resistive loads 138. In addition, voltage into auxiliary inputs 115-118 is adjusted again to nullify the DC offset voltage of sense amplifier 100.

Accordingly, as described above, calibrating sense amplifier 100 includes operations of selecting the voltage gain of sense amplifier 100 and nullifying the DC offset voltage. The calibration operations are repeated until either enough SFC circuits are determined suitable for generating a random data bit, or until the voltage gain of sense amplifier 100 has reached a maximum value and a determination is made that not enough suitable SFC circuits are available for generating a random data bit.

Figure 2:
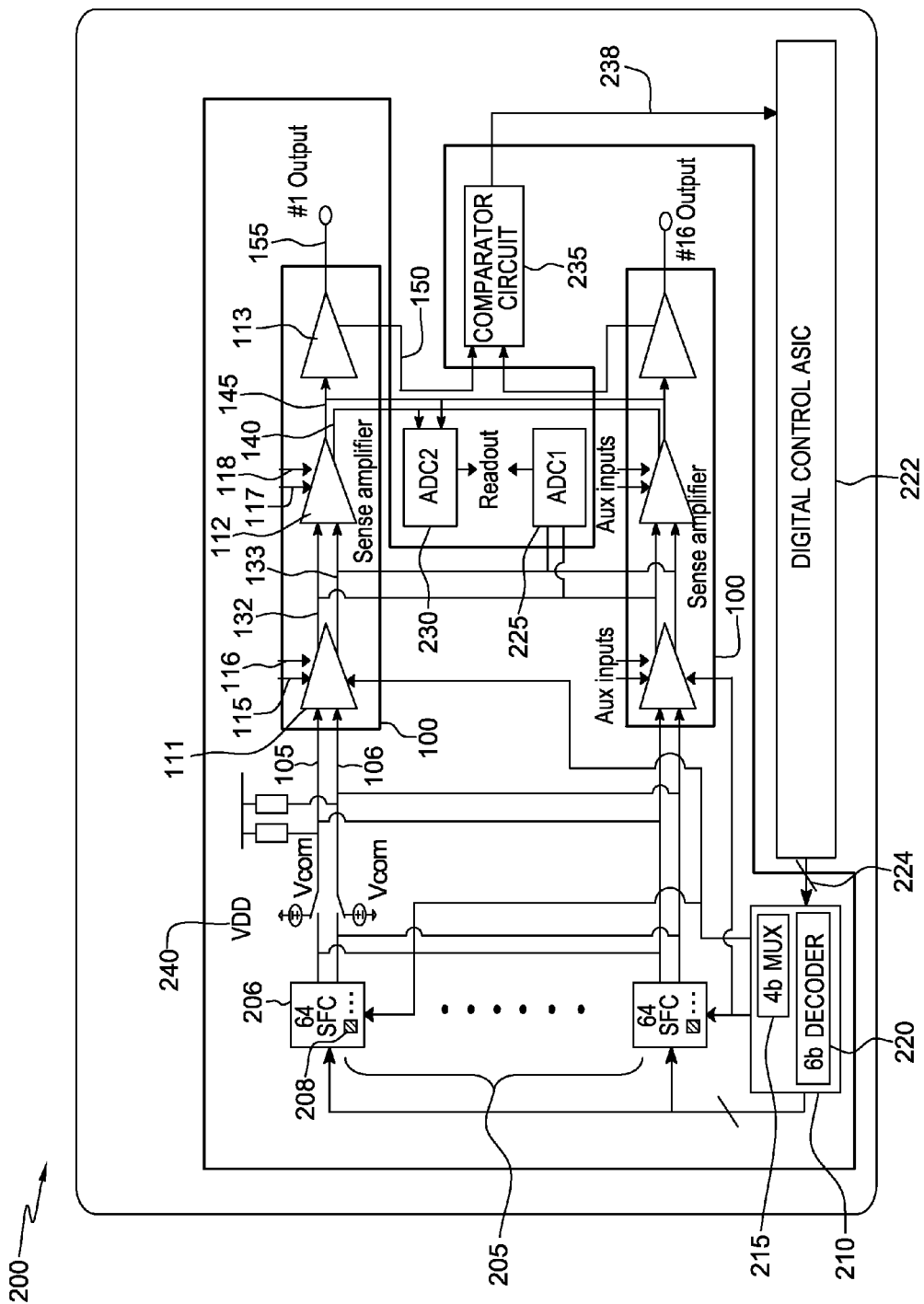
FIG. 2 is a block diagram of an integrated circuit system utilizing the sense amplifier of FIG. 1 to select a suitable single field-effect transistor comparison physically unclonable function circuit (SFC circuit) according to an embodiment of the present invention.

Referring now to FIG. 2, block diagram depicting an integrated circuit (IC) system 200 utilizing each sense amplifier 100 to select suitable SFC circuits that can be utilized for generating a random data bit sequence having N bits. IC system 200 includes an array 205 having one or more group of circuits 206, wherein each group of circuits 206 includes at least one SFC circuit 208. Specifically, in the disclosed embodiment, each group of circuits 206 includes sixty-four SFC circuits 208. In addition, combinatorial logic circuitry 210 is operatively connected to array 205 and sense amplifiers 100. Each group of circuits 206, within array 205, can be connected to a sense amplifier 100 by utilizing combinatorial logic circuitry 210. Particularly, combinatorial logic circuitry 210 includes 4-bit mux 215, and 6-bit decoder 220. Digital control application specific integrated circuit (ASIC) 222 is operatively connected to combinatorial logic circuitry 210 via bus 224. Digital control ASIC 222 can be programmed to send a signal, via bus 224, that activates 4-bit mux 215 to select a specific group of circuits 206. Moreover, digital control ASIC 222 can be further programmed to send a signal, via bus 224, that activates 6-bit decoder 220 to select a particular SFC circuit 208 within a specific group of circuits 206.

Furthermore, IC system 200 includes first analog-to-digital converter (ADC) 225 and second ADC 230, which are operatively connected to each sense amplifier 100. Specifically, first stage differential voltage output probing terminals 132 and 133 of each sense amplifier 100 are connected to first ADC 225. Also, probing terminals 140 and 145, from second stage 112, of each sense amplifier 100 are connected to ADC 230. ADC 225 and ADC 230 are utilized to monitor calibration of sense amplifier 100. Moreover, voltage at output 150, from third stage 113, is an input into comparator circuit 235. Comparator circuit 235 compares the voltage at output 150 to a configurable reference voltage. If the voltage at output 150 is at or above the configurable reference voltage then comparator circuit 235 sends a signal, via bus 238, to digital control ASIC 222 indicating that a SFC circuit 208 currently selected by combinatorial logic circuitry 210 is suitable for generating a strong random output voltage signal. However, if the voltage at output 150 is below the configurable reference voltage then comparator circuit 235 sends a signal, via bus 238, to digital control ASIC 222 indicating that the SFC circuit 208 currently selected by combinatorial logic circuitry 210 is not suitable for generating a strong random output voltage signal.

Figure 3:
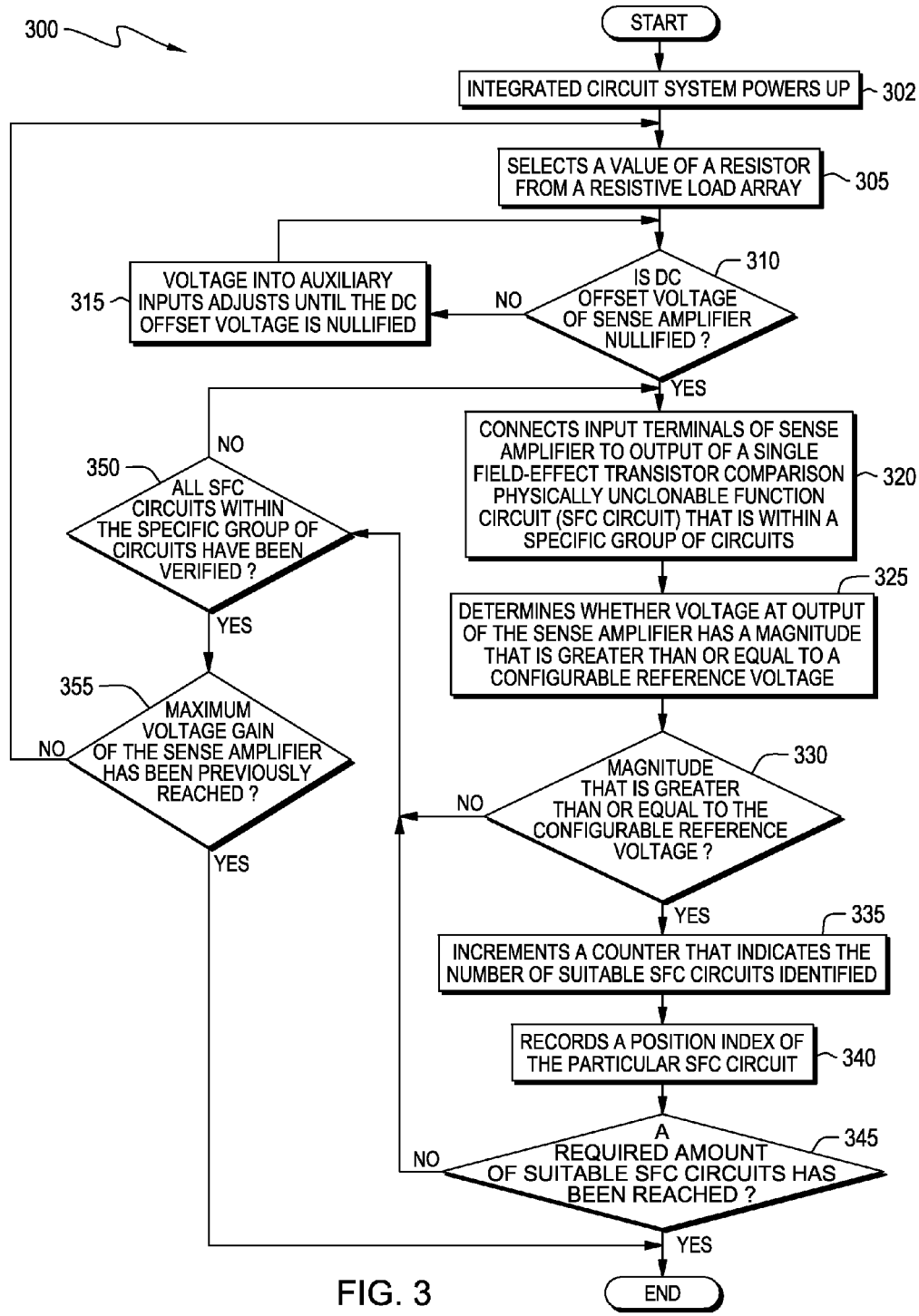
FIG. 3 is a flowchart of one embodiment of a method for utilizing the sense amplifier, within the integrated circuit system of FIG. 2, to select the suitable SFC circuit according to an embodiment of the present invention.

FIG. 3 depicts a flowchart 300 that illustrates the method for utilizing sense amplifier 100, within IC system 200, to select suitable SFC circuits 208. To calibrate sense amplifier 100, IC system 200 powers up (step 302). Next, amplifier gain selector 135 selects a value of a resistor from array of resistive loads 138, which sets a particular voltage gain for sense amplifier 100 (step 305). The value of the resistor can be selected such that sense amplifier 100 has minimum voltage gain to obtain enough SFC circuits 208 that generate the strongest random output voltage signal. However, voltage gain can be increased if not enough SFC circuits 208 can be obtained at the minimum voltage gain. Subsequently, a voltage probe measures DC offset voltage of sense amplifier 100. If the voltage probe indicates that the DC offset voltage of sense amplifier 100 is not nullified (decision 310, "NO" branch), then voltage into auxiliary inputs 115-118 adjusts until the DC offset voltage is nullified (step 315). The DC offset voltage is nullified if the DC offset voltage attributable to first stage 111a is less than about 0.2 uV and the DC offset voltage attributable to second stage 112 is less than about 15 uV. Thus, if the DC offset voltage attributable to first stage 111a is 0.2 uV or greater or the DC offset voltage attributable to second stage 112 is 15 uV or greater, then voltage into auxiliary inputs 115-118 adjusts until the DC offset voltage attributable to first stage 111a is less than about 0.2 uV and the DC offset voltage attributable to second stage 112 is less than about 15 uV. After the voltage probe indicates the DC offset voltage of sense amplifier 100 is nullified (decision 310, "YES" branch), then digital control ASIC 222 sends a signal, via bus 224, to combinatorial logic circuitry 210. Combinatorial logic circuitry 210 receives the signal from digital control ASIC 222, and in response to receiving the signal combinatorial logic circuitry 210 connects input terminals 105 and 106 of sense amplifier 100 to output of a SFC circuit 208 that is within a specific group of circuits 206 (step 320).

Next, comparator circuit 235 determines whether voltage at output 150 of sense amplifier 100 has a magnitude that is greater than or equal to a configurable reference voltage (step 325). In the disclosed embodiment, the magnitude of the configurable reference voltage is set to about 50 mV.

If voltage at output 150 of sense amplifier 100 has a magnitude that is less than the configurable reference voltage of 50 mV (decision 330, "NO" branch), then the particular SFC circuit 208 is not suitable for generating a strong random output voltage signal. Next, if digital control ASIC 222 determines that not all SFC circuits 208 within the specific group of circuits 206 have been verified (decision 350, "NO" branch), then combinatorial logic circuitry 210 receives a signal from digital control ASIC 222 to continue searching for a suitable SFC circuit 208.

However, if voltage at output 150 of sense amplifier 100 has a magnitude that is greater than or equal to the configurable reference voltage of 50 mV (decision 330, "YES" branch), then the particular SFC circuit 208 is suitable for generating a strong random output voltage signal. As a result, digital control ASIC 222 increments a counter that indicates an amount of suitable SFC circuits 208 identified (step 335), and subsequently records a position index of the particular SFC circuit 208 (step 340). Digital control ASIC 222 includes a computer readable storage medium on which the position index of the particular SFC circuit 208 is stored, wherein the position index can be used to locate the particular SFC circuit 208 within array 205. In addition, the particular SFC circuit 208 can be utilized to yield a random data bit sequence having N bits for purposes of authentication. Furthermore, if a required amount of suitable SFC circuits 208 has been reached (decision 345, "YES" branch), then the calibrations operations end.

Alternatively, if the required amount of suitable SFC circuits 208 has not been reached (decision 345, "NO" branch) and digital control ASIC 222 determines that not all SFC circuits 208 within the specific group of circuits 206 have been verified (decision 350, "NO" branch), then combinatorial logic circuitry 210 receives a signal from digital control ASIC 222 to continue searching for a suitable SFC circuit 208. In response to receiving the signal to continue searching for a suitable SFC circuit 208, combinatorial logic circuitry 210 connects input terminals 105 and 106 of sense amplifier 100 to output of a next SFC circuit 208 that is within the specific group of circuits 206 (step 320).

Moreover, if the required amount of suitable SFC circuits 208 has not been reached (decision 345, "NO" branch), digital control ASIC 222 determines that all SFC circuits 208 within the specific group of circuits 206 have been verified (decision 350, "YES" branch), but if maximum gain of sense amplifier 100 has not been previously reached (decision 355, "NO" branch) then amplifier gain selector 135 selects a new value of a resistor from array of resistive loads 138 (step 305), which sets a higher voltage gain for sense amplifier 100. Thus, the calibration process may continue until the required amount of suitable SFC circuits 208 is reached by searching through each group of circuits 206 within array 205.

However, if the required amount of suitable SFC circuits 208 has not been reached (decision 345, "NO" branch), digital control ASIC 222 determines that all SFC circuits 208 within the specific group of circuits 206 have been verified (decision 350, "YES" branch), and maximum gain of sense amplifier 100 has been previously reached (decision 355, "YES" branch) then the calibration process ends because the required amount of suitable SFC circuits 208 cannot be reached utilizing the current array 205. In the disclosed embodiment, each group of circuits 206 includes sixty-four SFC circuits, and the required amount of suitable SFC circuits 208 that needs to be reached within each group of circuits 206 is sixteen. Therefore, if sixteen suitable SFC circuits 208 cannot be identified within each group of circuits 206, then the current array 205 is discarded and calibration process ends. However, the calibration process can be performed on a different array 205 in order to obtain the required amount of suitable SFC circuits 208 needed by an end-user. In other embodiments, the amount of suitable SFC circuits 208 needed within each group of circuits 206 may be greater or less than sixteen, which will depend on end-user requirements.

The method flow diagram depicted in FIG. 3 illustrates the functionality and operation of possible implementations of integrated circuit components according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Furthermore, those skilled in the art will note from the above description, that presented herein is a novel structure and method that utilizes a sense amplifier to select a suitable circuit, wherein a suitable circuit generates a voltage that is greater than or equal to a configurable reference voltage.

Lastly, the foregoing description of various aspects of the invention has been presented for purposes of illustration and description. It is not intended to be exhaustive or to limit the invention to the precise form disclosed and, obviously, many modifications and variations are possible. Such modifications and variations that may be apparent to a person skilled in the art are intended to be included within the scope of the invention as defined by the accompanying claims.

What is claimed is:

1. A method for utilizing a sense amplifier to select a suitable circuit, the method comprising the steps of:

selecting a voltage gain of a sense amplifier having input terminals, auxiliary inputs, an output, an array of resistive loads, and an amplifier gain selector;

adjusting voltage into the auxiliary inputs to nullify direct current (DC) offset voltage of the sense amplifier;

connecting the input terminals of the sense amplifier to output terminals of a circuit that is within a group of circuits;

determining if the circuit generates a voltage greater than or equal to a configurable reference voltage, based on the output of the sense amplifier;

wherein the selected circuit includes at least one single field effect transistor comparison physically unclonable function (SFC circuit) that is selected to generate an authentication key;

wherein components of the selected circuit are selected from an array of SFC circuit components that is greater than the number of SFC circuit components needed to generate the authentication key;

wherein each component included in the array of SFC circuit components is selectively connectable to the output;

wherein data bits included in the authentication key are generated based on the integrated circuit components included in the sense amplifier;

wherein the SFC circuit is selected such that the SFC circuit generates a strong random output voltage signal that does not change polarity due to variations in the operating temperature of the SFC circuit; and wherein a resistive load is selected from the array of resistive loads to provide a differential voltage.

2. The method of claim 1, wherein:

selecting the voltage gain of the sense amplifier comprises selecting a value of a resistor from the array of resistive loads that includes a variety of resistor values, and the value of the resistor that is selected corresponds to a sensitivity level that needs to be reached in order to achieve a desired strong voltage signal at the output of the sense amplifier; and the amplifier gain selector is utilized for selecting the value of the resistor from the array of resistive loads.

3. The method of claim 2, wherein:

the sense amplifier comprises a first stage and a second stage that each include a pair of n-type field-effect transistors that are controlled by a pair of p-type field-effect transistors; and adjusting voltage into the auxiliary inputs further comprises applying a voltage at the auxiliary inputs to generate a delta change in current that nullifies the DC offset voltage of the sense amplifier such that an amount of the DC offset voltage attributable to the first stage is less than a first configurable threshold of about 0.2 uV, and an amount of the DC offset voltage attributable to the second stage is less than a second configurable threshold of about 15 uV; and wherein the strong random output voltage signal does not change polarity due to variations in the operating temperature of the SFC circuit when the DC offset voltage attributable to the first stage is less than a first configurable threshold of about 0.2 uV, and an amount of the DC offset voltage attributable to the second stage is less than a second configurable threshold of about 15 uV.

4. The method of claim 2, wherein the sense amplifier comprises an inverted output, and wherein the output or the inverted output of the sense amplifier is utilized to yield a random data bit sequence having N bits, for purposes of authentication.

5. The method of claim 1, wherein connecting the input terminals of the sense amplifier to output terminals of the circuit comprises utilizing combinatorial logic circuitry that selects the circuit that is within the group of circuits to connect to the sense amplifier.

6. The method of claim 5, wherein the combinatorial logic circuitry comprises a 4-bit mux and 6-bit decoder that, when activated, result in the selection of at least one component included in the SFC circuit.

7. The method of claim 1, wherein the circuit is a single field-effect transistor comparison physically unclonable function circuit.

8. The method of claim 1, wherein:
determining if the circuit generates the voltage greater than or equal to the configurable reference voltage comprises comparing voltage at the output of the sense amplifier to the configurable reference voltage, and incrementing a counter if the voltage at the output of the sense amplifier is greater than or equal to the configurable reference voltage; and
the counter indicates an amount of suitable circuits identified.

9. The method of claim 8, wherein a comparator circuit is utilized for comparing voltage at the output of the sense amplifier to the configurable reference voltage.

10. The method of claim 8, wherein determining if the circuit is suitable further comprises recording a position index of the circuit with a digital control application specific integrated circuit (ASIC), if the voltage at the output of the sense amplifier is greater than or equal to the configurable reference voltage.

11. The method of claim 8, wherein determining if the circuit is suitable further comprises searching for other suitable circuits within the array and the group of circuits to obtain a required amount of suitable circuits, and wherein the array can include more than one of the group of circuits.

12. The method of claim 8, wherein determining if the circuit is suitable further comprises increasing the voltage gain of the sense amplifier by selecting a resistor having a resistivity value corresponding to the voltage gain of the sense amplifier, the resistor being selected from the array of resistive loads that includes a plurality of resistors that respectively have different resistivity values.

13. A structure utilizing a sense amplifier to select a circuit, the structure comprising:
at least one array that includes one or more groups of circuits from which a circuit is selected;
at least one sense amplifier operatively connected to combinatorial logic circuitry, each of the one or more groups of circuits, a first analog-to-digital converter (ADC), a second ADC, and a comparator circuit having an output;
a digital control application specific integrated circuit (ASIC) that is operatively connected to the combinatorial logic circuitry and the comparator circuit;
wherein the selected circuit includes at least one single field effect transistor comparison physically unclonable function (SFC circuit) that is selected to generate an authentication key;
wherein components of the selected circuit are selected from an array of SFC circuit components that is greater than the number of SFC circuit components needed to generate the authentication key;
wherein each component included in the array of SFC circuit components is selectively connectable to the output;
wherein data bits included in the authentication key are generated based on the integrated circuit components included in the sense amplifier;
wherein the SFC circuit is selected such that the SFC circuit generates a strong random output voltage signal that does not change polarity due to variations in the operating temperature of the SFC circuit; and
wherein a resistive load is selected from the array of resistive loads to provide a differential voltage.

14. The structure of claim 13, wherein the one or more groups of circuits comprises at least one single field-effect transistor comparison physically unclonable function circuit.

15. The structure of claim 13, wherein the combinatorial logic circuitry comprises a 4-bit mux and 6-bit decoder that, when activated, result in the selection of at least one component included in the SFC circuit, and wherein the combinatorial logic circuitry is operatively connected to the one or more groups of circuits and the at least one sense amplifier.

16. The structure of claim 13, wherein a) the at least one sense amplifier comprises input terminals, auxiliary inputs, probing terminals, an output, an array of resistive loads, and a first stage and a second stage that each include a pair of n-type field-effect transistors that are controlled by a pair of p-type field-effect transistors b) adjusting voltage into the auxiliary inputs further comprises applying a voltage at the auxiliary inputs to generate a delta change in current that nullifies the DC offset voltage of the sense amplifier such that an amount of the DC offset voltage attributable to the first stage is less than a first configurable threshold of about 0.2 uV, and an amount of the DC offset voltage attributable to the second stage is less than a second configurable threshold of about 15 uV, and c) the strong random output voltage signal does not change polarity due to variations in the operating temperature of the SFC circuit when the DC offset voltage attributable to the first stage is less than a first configurable threshold of about 0.2 uV, and an amount of the DC offset voltage attributable to the second stage is less than a second configurable threshold of about 15 uV.

17. The structure of claim 16, wherein the digital control ASIC comprises a computer readable storage medium and a counter for indicating an amount of suitable circuits, and wherein the amount of suitable circuits is stored on the computer readable storage medium.

18. The structure of claim 16, wherein the output of the at least one sense amplifier is connected to the comparator circuit, and wherein the output of the comparator circuit is connected to the digital control ASIC.

19. The structure of claim 16, wherein the first stage comprises a first pair of the auxiliary inputs and a first pair of probing terminals, and wherein the second stage comprises a second pair of pair of the auxiliary inputs and a second pair of probing terminals.

20. The structure of claim 19, wherein the first pair of probing terminals is connected to the first ADC converter, and wherein the second pair of probing terminals is connected to the second ADC converter.

* * * * *